(12) United States Patent
Chang et al.

(10) Patent No.: US 8,586,449 B1
(45) Date of Patent: Nov. 19, 2013

(54) RAISED ISOLATION STRUCTURE SELF-ALIGNED TO FIN STRUCTURES

(75) Inventors: Josephine B. Chang, Mahopac, NY (US); Paul Chang, Mahopac, NY (US); Michael A. Guillorn, Yorktown Heights, NY (US); Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/603,872

(22) Filed: Sep. 5, 2012

Related U.S. Application Data

(63) Continuation of application No. 13/584,924, filed on Aug. 14, 2012.

(51) Int. Cl.
*H01L 21/76* (2006.01)

(52) U.S. Cl.
USPC .................. 438/432; 257/296; 257/528

(58) Field of Classification Search
USPC ................... 438/432; 257/296, 528
See application file for complete search history.

(56) References Cited

U.S. PATENT DOCUMENTS

| | | | |
|---|---|---|---|
| 7,224,029 B2 | 5/2007 | Anderson et al. | |
| 7,368,354 B2 | 5/2008 | Anderson et al. | |
| 7,534,686 B2 | 5/2009 | Lee et al. | |
| 7,964,893 B2 | 6/2011 | Lee | |
| 8,116,121 B2 | 2/2012 | Kawasaki | |
| 8,153,493 B2 | 4/2012 | Lee | |
| 2004/0262676 A1 | 12/2004 | Lee et al. | |
| 2007/0134884 A1 | 6/2007 | Kim et al. | |
| 2007/0158756 A1 | 7/2007 | Dreeskornfeld et al. | |
| 2007/0158764 A1 | 7/2007 | Orlowski et al. | |
| 2007/0170522 A1 | 7/2007 | Lee et al. | |
| 2008/0111184 A1* | 5/2008 | Beintner et al. | 257/327 |
| 2009/0206443 A1 | 8/2009 | Juengling | |
| 2009/0278183 A1 | 11/2009 | Lee | |

FOREIGN PATENT DOCUMENTS

EP 2455967 A1 5/2012

OTHER PUBLICATIONS

Office Action dated Dec. 21, 2012, received in a related U.S. Appl. No. 13/584,924.
Notice of Allowance, dated Jul. 17, 2013, received in a related U.S. Appl., namely U.S. Appl. No. 13/584,924.

* cited by examiner

*Primary Examiner* — Jarrett Stark
*Assistant Examiner* — John M Parker
(74) *Attorney, Agent, or Firm* — Scully, Scott, Murphy & Presser, P.C.; Louis J. Percello, Esq.

(57) ABSTRACT

Raised isolation structures can be formed at the same level as semiconductor fins over an insulator layer. A template material layer can be conformally deposited to fill the gaps among the semiconductor fins within each cluster of semiconductor fins on an insulator layer, while the space between adjacent clusters is not filled. After an anisotropic etch, discrete template material portions can be formed within each cluster region, while the buried insulator is physically exposed between cluster regions. A raised isolation dielectric layer is deposited and planarized to form raised isolation structures employing the template material portions as stopping structures. After removal of the template material portions, a cluster of semiconductor fins are located within a trench that is self-aligned to outer edges of the cluster of semiconductor fins. The trench can be employed to confine raised source/drain regions to be formed on the cluster of semiconductor fins.

22 Claims, 18 Drawing Sheets

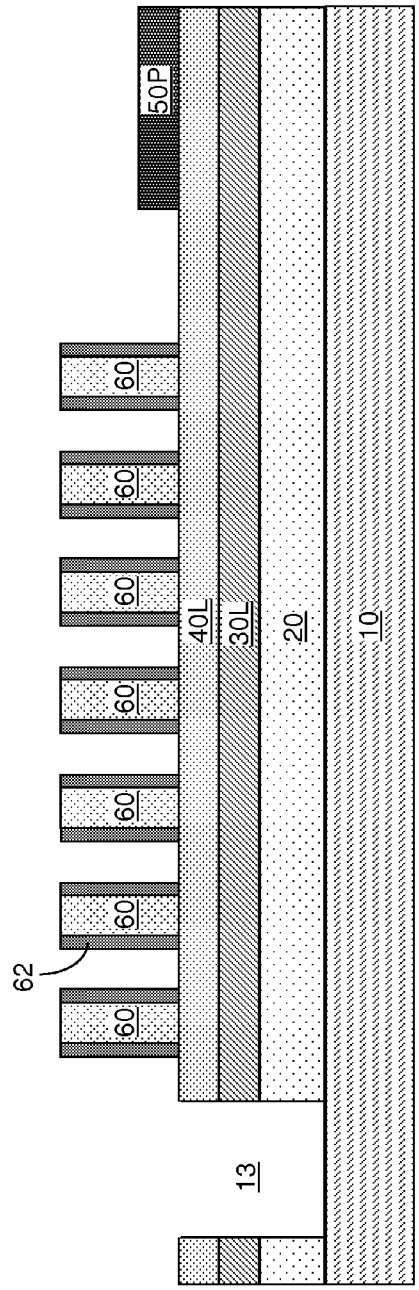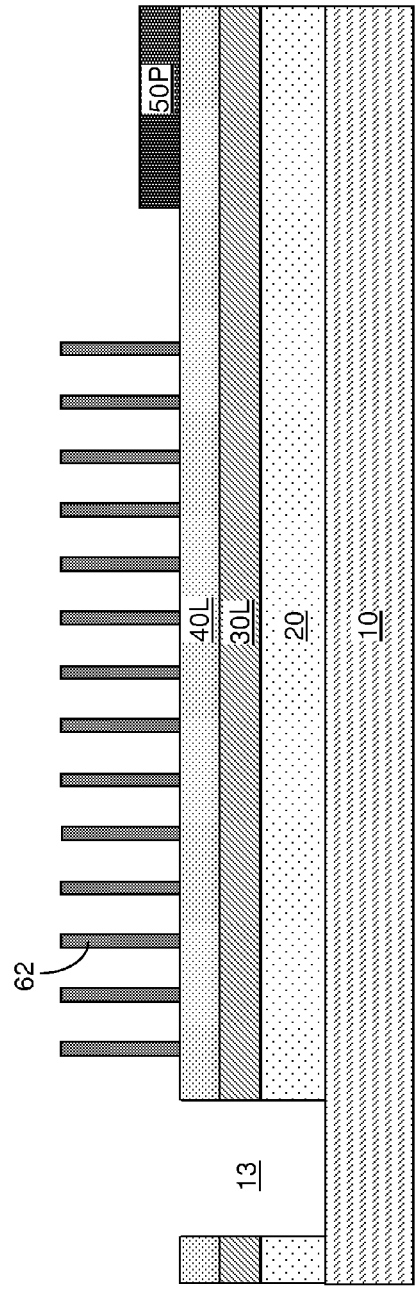

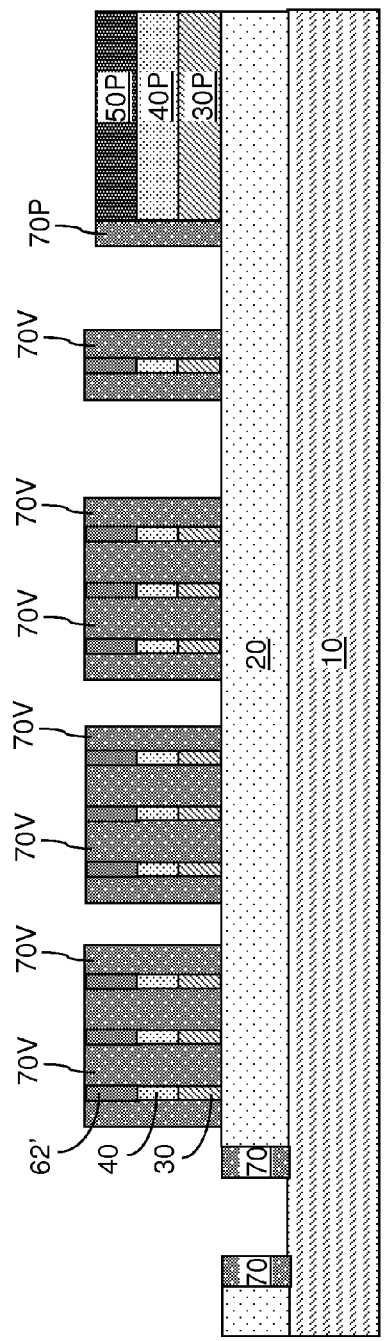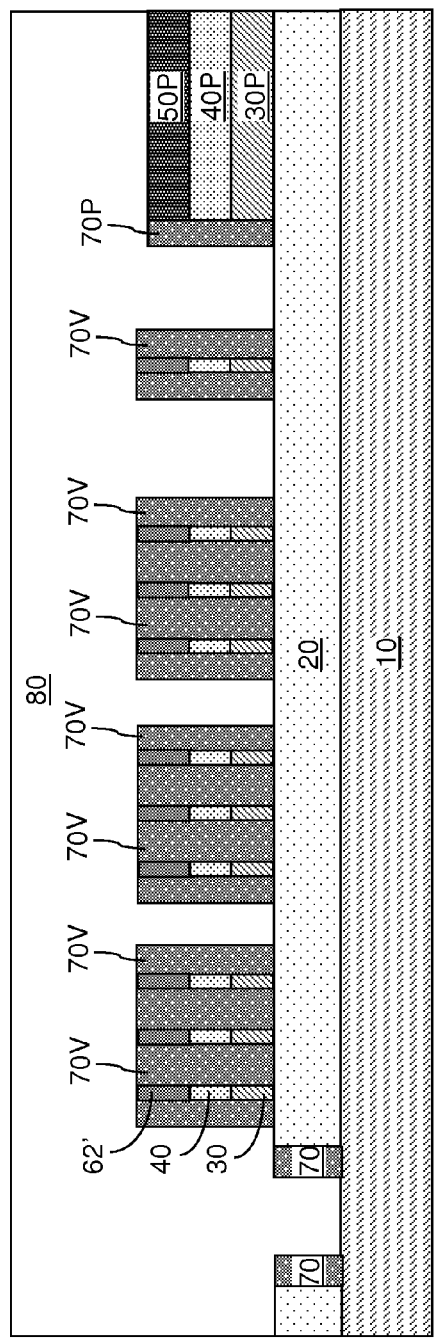

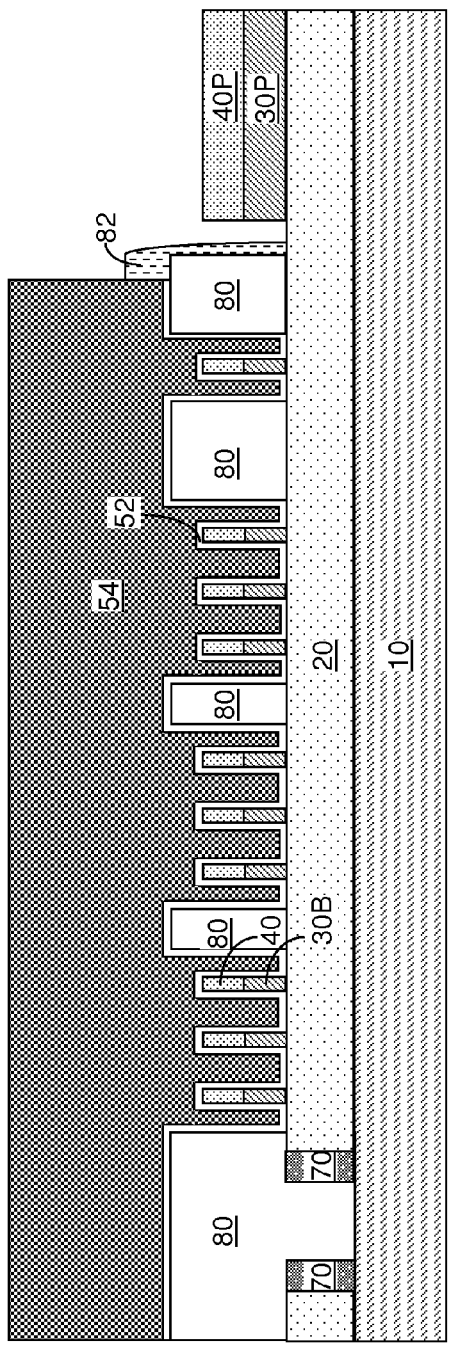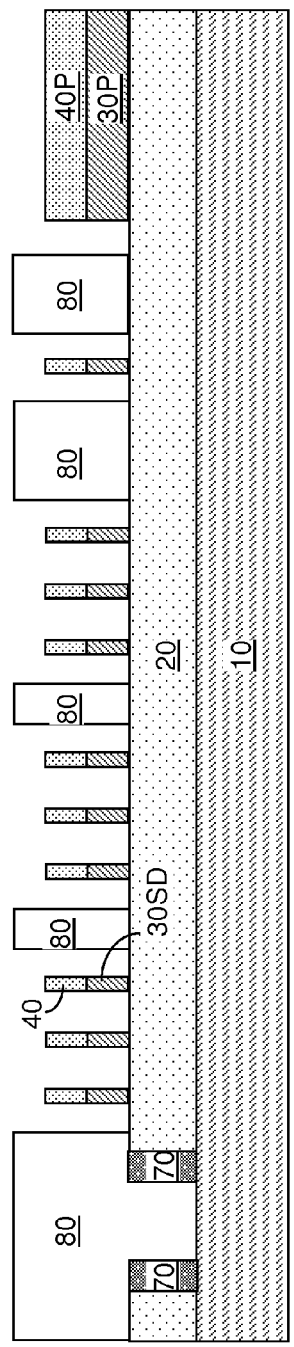
FIG. 17A
FIG. 17B

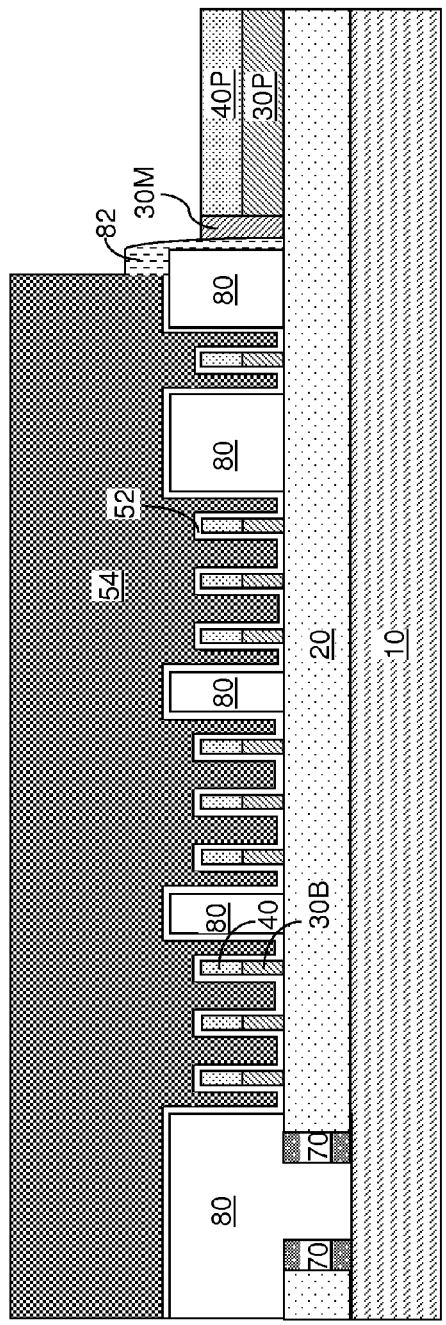
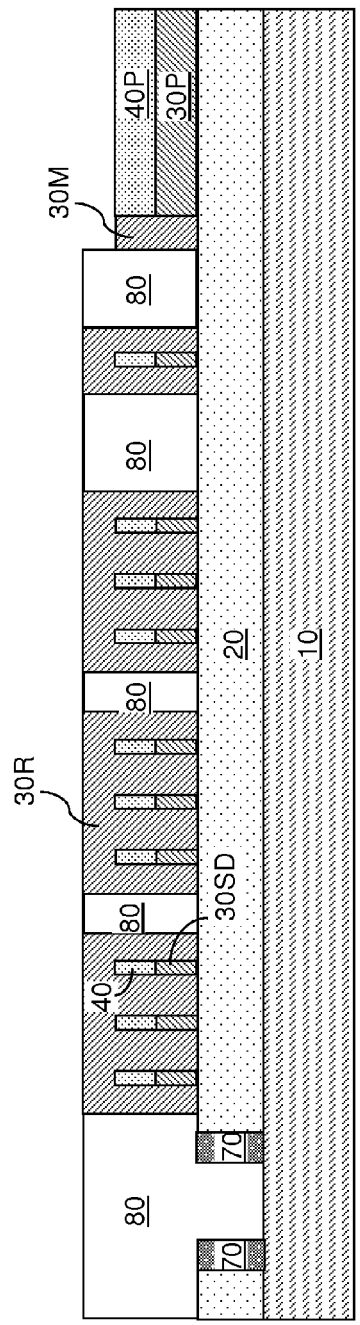
FIG. 18A
FIG. 18B

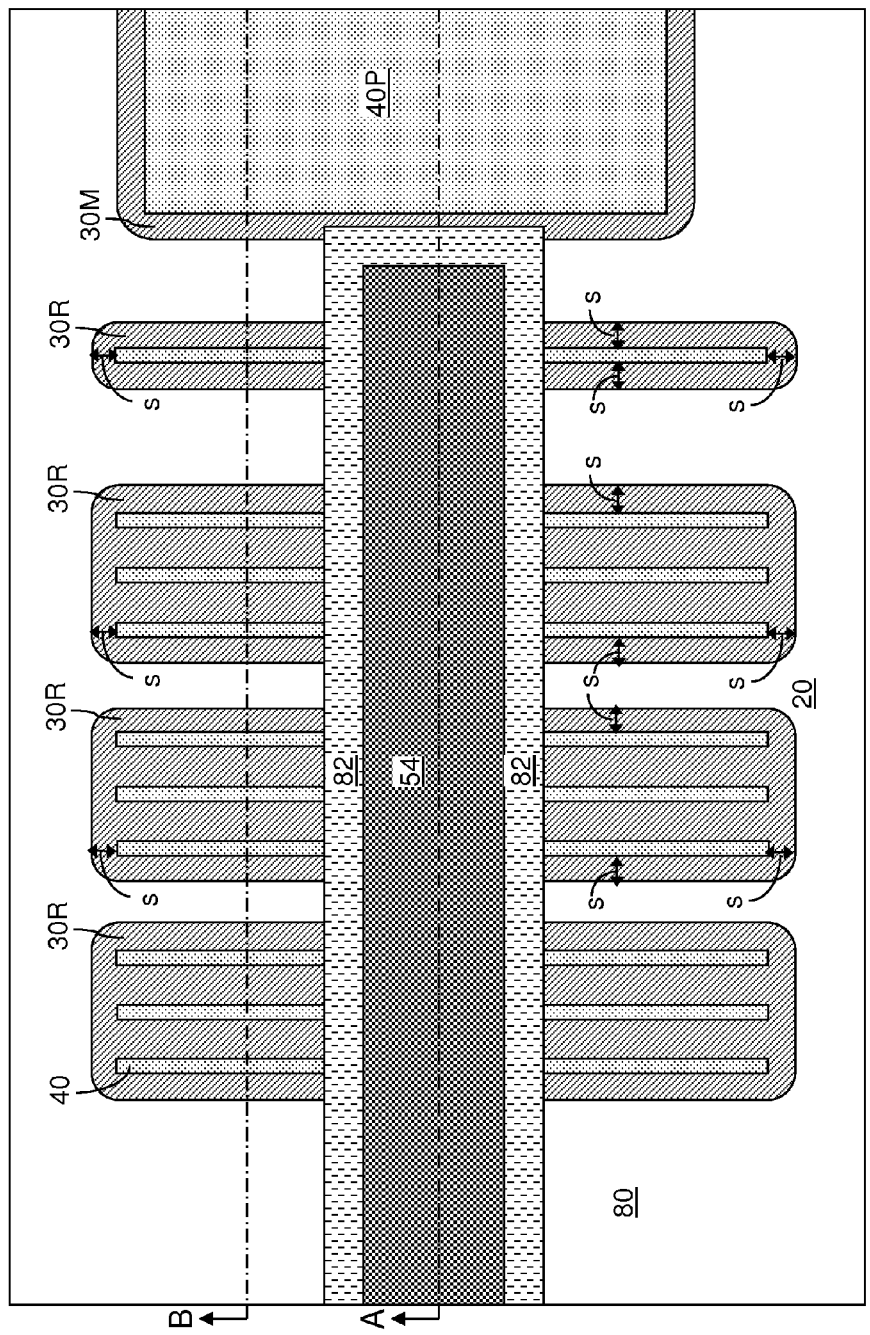

RAISED ISOLATION STRUCTURE SELF-ALIGNED TO FIN STRUCTURES

CROSS REFERENCE TO RELATED APPLICATION

This application is a continuation of U.S. patent application Ser. No. 13/584,924, filed Aug. 14, 2012 the entire content and disclosure of which is incorporated herein by reference.

BACKGROUND

The present disclosure relates to a semiconductor structure, and particularly to a raised isolation structure that is self-aligned to semiconductor fin structures and a method of manufacturing the same.

Fin field effect transistors (finFETs) employ semiconductor fins, which introduce on-wafer topography. The on-wafer topography makes it difficult to lithographically pattern upper level structures and/or to fill narrow trenches formed in an overlying dielectric layer. Further, growth of epitaxially grown raised source/drain regions is not laterally confined, thereby providing the potential to electrically short a pair of adjacent finFETs during the formation of the raised source/drain regions.

SUMMARY

Raised isolation structures can be formed at the same level as semiconductor fins over an insulator layer. An array of semiconductor fins can be patterned to provide clusters of semiconductor fins that are laterally spaced by a narrow spacing, while the spacing between adjacent clusters is greater than the width of the narrow spacing. A template material layer can be conformally deposited to fill the gaps among the semiconductor fins within each cluster of semiconductor fins, while the space between adjacent clusters is not filled. After an anisotropic etch, discrete template material portions can be formed within each cluster region, while the buried insulator is physically exposed between cluster regions. A raised isolation dielectric layer is deposited and planarized to form raised isolation structures employing the template material portions as stopping structures. After removal of the template material portions, a cluster of semiconductor fins are located within a trench that is self-aligned to outer edges of the cluster of semiconductor fins. The trench can be employed to confine raised source/drain regions to be formed on the cluster of semiconductor fins.

According to an aspect of the present disclosure, a semiconductor structure is provided, which includes at least one semiconductor fin located on a surface of a substrate, and a raised isolation dielectric layer located on the surface of the substrate and including a trench therein. The at least one semiconductor fin is located within the trench, vertical sidewalls of the trench are laterally spaced from outermost sidewalls of the at least one semiconductor fin by a same lateral spacing.

According to another aspect of the present disclosure, a method of forming a semiconductor structure is provided. At least one semiconductor fin is formed on an insulator layer. A template material portion is formed directly on the at least one semiconductor fin. A raised dielectric layer is formed on the insulator layer by depositing a dielectric material on the insulator layer and the template material portion and planarizing the dielectric material. A trench is formed by removing the template material portion selective to the raised dielectric layer. Vertical sidewalls of the trench are laterally spaced from outermost sidewalls of the at least one semiconductor fin by a same lateral spacing.

BRIEF DESCRIPTION OF SEVERAL VIEWS OF THE DRAWINGS

FIG. 7 is a vertical cross-sectional view of the exemplary semiconductor structure after patterning the fin-defining dielectric layer into fin-defining dielectric spacers according to an embodiment of the present disclosure.

FIG. 8 is a vertical cross-sectional view of the exemplary semiconductor structure after removal of the plurality of mandrel structures according to an embodiment of the present disclosure.

FIG. 13A is a vertical cross-sectional view of the exemplary semiconductor structure after formation of template material portions by anisotropically etching the template material layer according to an embodiment of the present disclosure.

FIG. 14 is a vertical cross-sectional view of the exemplary structure after deposition of a raised dielectric layer according to an embodiment of the present disclosure.

FIG. 17A is a vertical cross-sectional view of the exemplary structure after formation of a gate dielectric, a gate electrode, and a gate spacer along a vertical plane A-A' of FIG. 17C according to an embodiment of the present disclosure.

FIG. 17B is a vertical cross-sectional view of the exemplary structure at the processing step of FIG. 17C along a vertical plane B-B' of FIG. 17C according to an embodiment of the present disclosure.

FIG. 18A is a vertical cross-sectional view of the exemplary structure after formation of a raised source region and a raised drain region along a vertical plane A-A' of FIG. 18 according to an embodiment of the present disclosure.

FIG. 18B is a vertical cross-sectional view of the exemplary structure at the processing step of FIG. 18C along a vertical plane B-B' of FIG. 18C according to an embodiment of the present disclosure.

FIG. 18C is a top-down view of the exemplary structure at the processing steps of FIGS. 18A and 18B according to an embodiment of the present disclosure.

DETAILED DESCRIPTION

Figure 1:
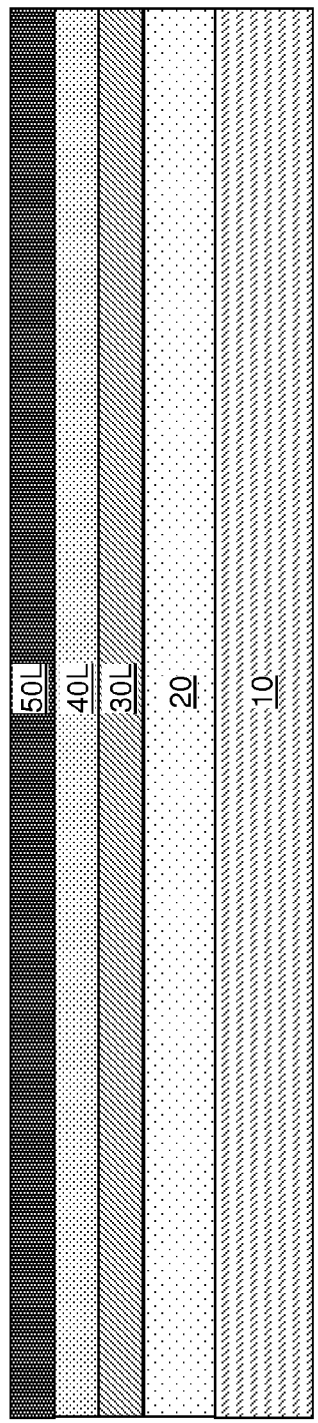
FIG. 1 is a vertical cross-sectional view of an exemplary semiconductor structure after formation of a first dielectric layer and a second dielectric layer on a semiconductor-on-insulator (SOI) substrate according to an embodiment of the present disclosure.

As stated above, the present disclosure relates to a raised isolation structure that is self-aligned to semiconductor fin structures and a method of manufacturing the same. Aspects of the present disclosure are now described in detail with accompanying figures. It is noted that like reference numerals refer to like elements across different embodiments. The drawings are not necessarily drawn to scale.

Referring to FIG. 1, an exemplary semiconductor structure according to an embodiment of the present disclosure includes a semiconductor substrate and at least one dielectric layer formed thereupon. In one embodiment, the semiconductor substrate can be a semiconductor-on-insulator (SOI) substrate including a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 is an insulator layer including a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may or may not be doped with p-type dopants and/or n-type dopants. The first semiconductor material can be a single crystalline semiconductor material, a polycrystalline semiconductor material, or an amorphous semiconductor material. In one embodiment, the first semiconductor material can be silicon. In one embodiment, the first semiconductor material can be single crystalline silicon. The thickness of the top semiconductor layer 30L can be from 10 nm to 200 nm, although lesser and greater thicknesses can also be employed.

The at least one dielectric layer can include, for example, a stack, from bottom to top, of a first dielectric layer 40L and a second dielectric layer 50L. The dielectric materials of the first dielectric layer 40L and the second dielectric layer 50L can be, for example, silicon oxide, silicon oxynitride, a dielectric metal oxide, or a combination thereof. The first dielectric layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the first dielectric layer 40L can be from 2 nm to 30 nm, although lesser and greater thicknesses can also be employed. The second dielectric layer 50L can be formed, for example, by CVD. The thickness of the second dielectric layer 50L can be from 10 nm to 100 nm, although lesser and greater thicknesses can also be employed. In one embodiment, the first dielectric layer 40L can include silicon oxide, and the second dielectric layer 50L can include silicon nitride.

Figure 2:
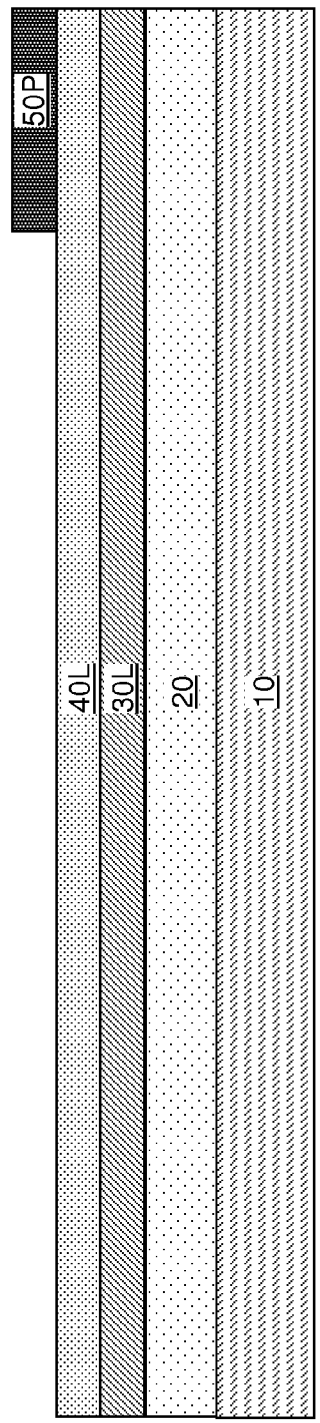
FIG. 2 is a vertical cross-sectional view of the exemplary semiconductor structure after patterning the second dielectric layer according to an embodiment of the present disclosure.

Referring to FIG. 2, the second dielectric layer 50L can be patterned to define a planar device region in which a planar semiconductor devices can be subsequently formed. The planar semiconductor devices can include a contiguous semiconductor material portion that laterally extends over a greater distance than the thickness of the top semiconductor layer 30L. For example, the planar semiconductor devices can include a planar field effect transistor as known in the art, and/or any other semiconductor devices that do not require formation of a semiconductor fin. Each remaining portion of the second dielectric layer 50L is herein referred to as an upper dielectric pad portion 50P.

Figure 3:
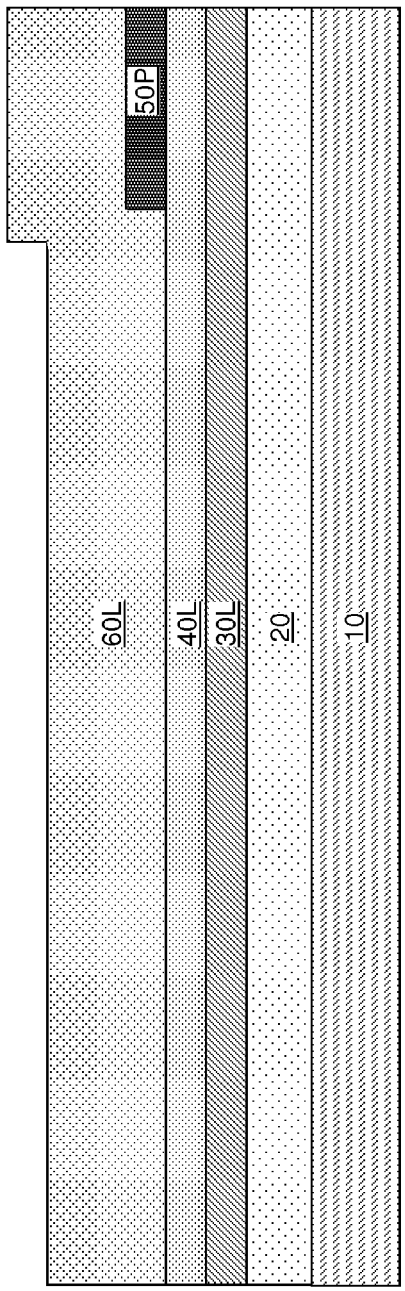
FIG. 3 is a vertical cross-sectional view of the exemplary semiconductor structure after formation of a mandrel material layer according to an embodiment of the present disclosure.

Referring to FIG. 3, a mandrel material layer 60L is deposited over the first dielectric layer 40L and the upper dielectric pad portion 50P. The mandrel material layer 60L includes a material that can be removed selective to the materials of the first dielectric layer 40L and the upper dielectric pad portion 50P. In one embodiment, the mandrel material layer 60L can include amorphous silicon, polysilicon, amorphous or polycrystalline germanium, an amorphous or polycrystalline silicon-germanium alloy material, amorphous carbon, diamond-like carbon, or organosilicate glass. The thickness of the mandrel material layer 60L can be, for example, from 30 nm to 300 nm, although lesser and greater thicknesses can also be employed. The mandrel material layer 60L can be deposited, for example, by chemical vapor deposition (CVD).

Figure 4:
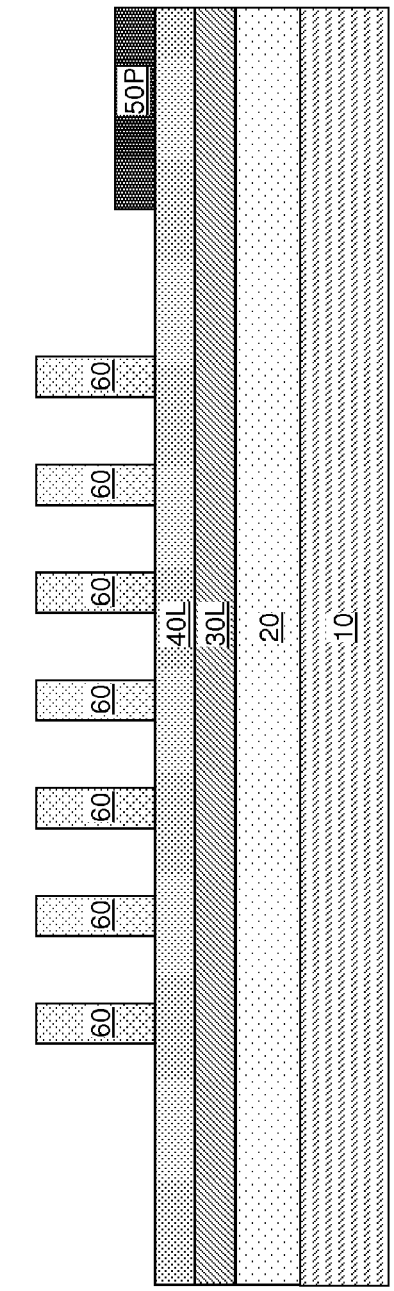
FIG. 4 is a vertical cross-sectional view of the exemplary semiconductor structure after patterning of the mandrel material layer into a plurality of mandrel structures according to an embodiment of the present disclosure.

Referring to FIG. 4, the mandrel material layer 60L is patterned to form a plurality of mandrel structures 60. The patterning of the mandrel material layer 60L can be performed, for example, by applying a photoresist layer (not shown) above the mandrel material layer 60L, lithographically patterning the photoresist layer to define a set of areas covered by the patterned photoresist layer, and transferring the pattern in the photoresist layer into the mandrel material layer 60L by an anisotropic etch. The anisotropic etch can be selective to the dielectric materials of the first dielectric layer 40L and the upper dielectric pad portion 50P. The patterned portions of the mandrel material layer are herein referred to as mandrel structures 60.

In one embodiment, the patterned photoresist layer and the mandrel dielectric layer 60L can have rectangular shapes as seen from above. In one embodiment, the rectangular shapes can be the same across a plurality of portions of the patterned photoresist layer, and across a plurality of mandrel structures. In one embodiment, the mandrel structures 60 can form a one-dimensional array of periodic patterns that is repeated along a horizontal direction, e.g., along the horizontal direction within the plane of the vertical cross-sectional view of FIG. 4. In one embodiment, the width of each mandrel structures 60 within a one-dimensional periodic pattern of the plurality of mandrel structures 60 can be less than the spacing between adjacent mandrel structures 60. In other words, the width of each mandrel structures 60 within a one-dimensional periodic pattern of the plurality of mandrel structures 60 can be less than one half of the pitch of the one-dimensional periodic pattern of the plurality of mandrel structures 60. In one embodiment, the width of each mandrel structures 60 within a one-dimensional periodic pattern of the plurality of mandrel structures 60 can be selected to be less than one half of the pitch of the one-dimensional periodic pattern of the plurality of mandrel structures 60 by the thickness of a fin-defining dielectric layer to be subsequently deposited on the plurality of mandrel structures 60.

Figure 5:
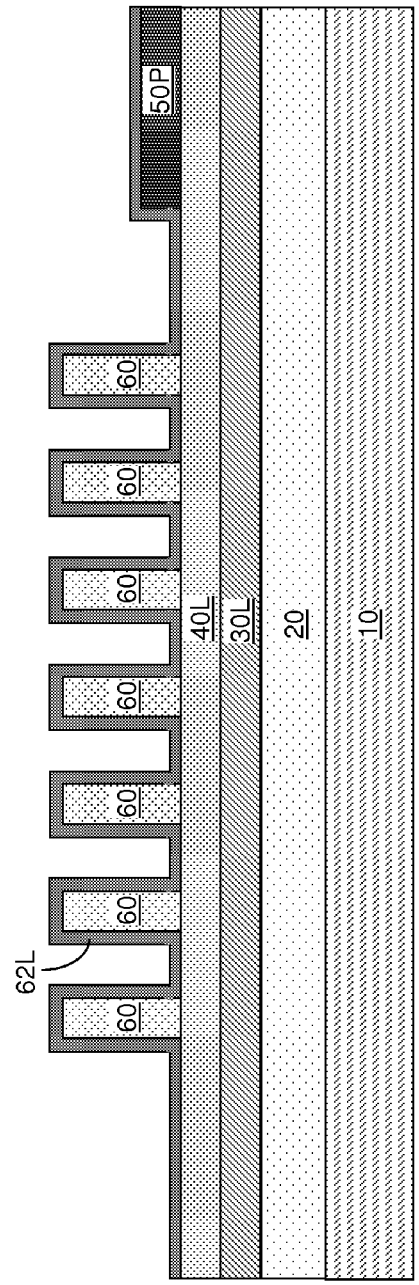
FIG. 5 is a vertical cross-sectional view of the exemplary semiconductor structure after formation of a fin-defining dielectric layer according to an embodiment of the present disclosure.

Referring to FIG. 5, a fin-defining dielectric layer 62L is deposited on all physically exposed surfaces of the plurality of mandrel structures 60, the first dielectric layer 40L, and the upper dielectric pad portion 50P. Portions of the fin-defining dielectric layer 62L are subsequently employed to define shapes of semiconductor fins. Further, the lateral thickness of the fin-defining dielectric layer 62L as measured on sidewalls of the plurality of mandrel structures 60 define the lateral width of each semiconductor fin to be subsequently formed. In addition, the locations of the semiconductor fins to be subsequently formed are defined by the locations of the vertical portions of the fin-defining dielectric layer 62L. Because the locations and features of the fin-defining dielectric layer 62 define locations and features of the semiconductor fins to be subsequently formed, the fin-defining dielectric layer 62 are herein referred to as a "fin-defining" dielectric layer.

The fin-defining dielectric layer 62L includes a dielectric material that is different from the dielectric material of the first dielectric layer 40L. If the plurality of mandrel structures 60 includes a dielectric material, the fin-defining dielectric layer 62L includes a dielectric material that is different from the dielectric material of the plurality of mandrel structures 60. The fin-defining dielectric layer 62L can include the same material as, or can include a material different from, the material of the upper dielectric pad portion 50P. In one embodiment, the fin-defining dielectric layer 62L can include silicon nitride, a dielectric metal oxide (e.g., $HfO_2$), a dielectric metal nitride, or a dielectric metal oxynitride. The fin-defining dielectric layer 62L is deposited as a conformal layer, i.e., a layer having the same thickness at horizontal portions and at vertical portions. The fin-defining dielectric layer 62L can be deposited, for example, by low pressure chemical vapor deposition (LPCVD) or atomic layer deposition (ALD).

Figure 6:
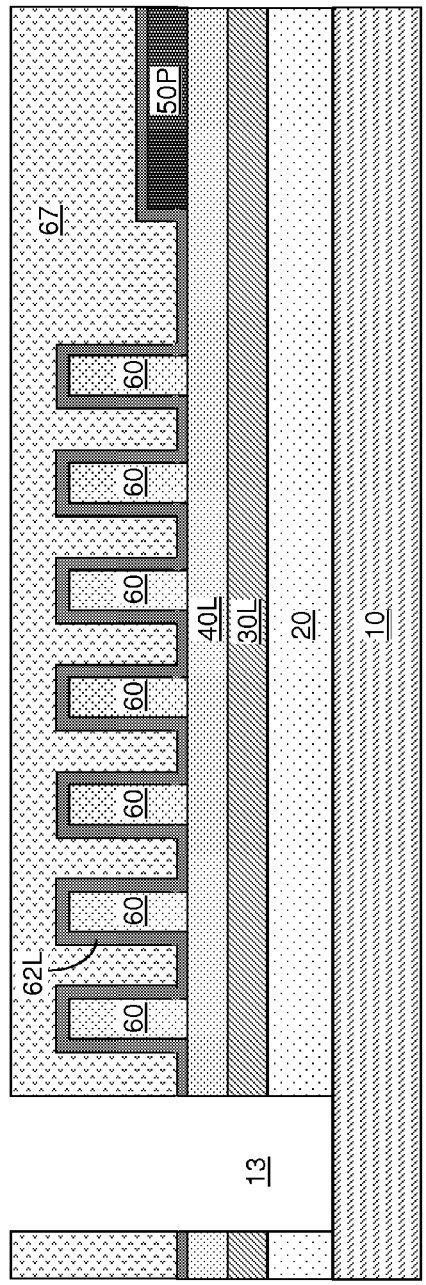
FIG. 6 is a vertical cross-sectional view of the exemplary semiconductor structure after formation of a trench through a buried insulator layer according to an embodiment of the present disclosure.

Referring to FIG. 6, a trench 13 can be optionally formed through the first dielectric layer 40L, the top semiconductor layer, 30L, and the buried insulator layer 20. For example, a photoresist layer 67 can be applied over the fin-defining dielectric layer 62L, and subsequently patterned to form an opening therein. The pattern of the opening is transferred through the fin-defining dielectric layer 62L, the first dielectric layer 40L, the top semiconductor layer, 30L, and the buried insulator layer 20 to form the trench 13. In one embodiment, the trench 13 can be employed to pattern an alignment mark for lithographic processes. The photoresist layer 67 is subsequently removed, for example, by ashing.

Referring to FIG. 7, the fin-defining dielectric layer 62L is anisotropically etched, for example, by a reactive ion etch (RIE), to form a plurality of fin-defining dielectric spacers 62. Specifically, the horizontal portions of the fin-defining dielectric layer 62L are etched through in an anisotropic etch until the top surfaces of the first dielectric layer 40L and the upper dielectric pad portion 50P are physically exposed. The remaining vertical portions of the fin-defining dielectric layer 62L after the anisotropic etch constitute the plurality of fin-defining dielectric spacers 62. The fin-defining dielectric spacers 62 have the same width throughout.

In one embodiment, the plurality of mandrel structures 60 can be a periodic one-dimensional array of periodic structures having a pitch, and the width of each portion of the fin-defining dielectric spacers 62 can be the same as one half of the pitch less the width of a mandrel structure 60. In one embodiment, each of the plurality of mandrel structures 60 can have a shape of a rectangular parallelepiped, and each of the plurality of fin-defining dielectric spacers 62 can have a cross-sectional shape of a rectangular ring, i.e., a three-dimensional object having a same horizontal cross-sectional area throughout such that the shape of the horizontal cross-sectional are is an area of a larger rectangle less an area of a smaller rectangle that has the same geometrical center as the larger rectangle. Further, the width of each fin-defining dielectric spacer 62 is the same throughout.

Referring to FIG. 8, the plurality of mandrel structures 60 is removed selective to the plurality of fin-defining dielectric spacers 62. For example, if the plurality of mandrel structures 60 includes a semiconductor material, the plurality of mandrel structures 60 can be removed by a wet etch that removes the semiconductor material while not removing the dielectric material of the plurality of fin-defining dielectric spacers 62.

Figure 9A:
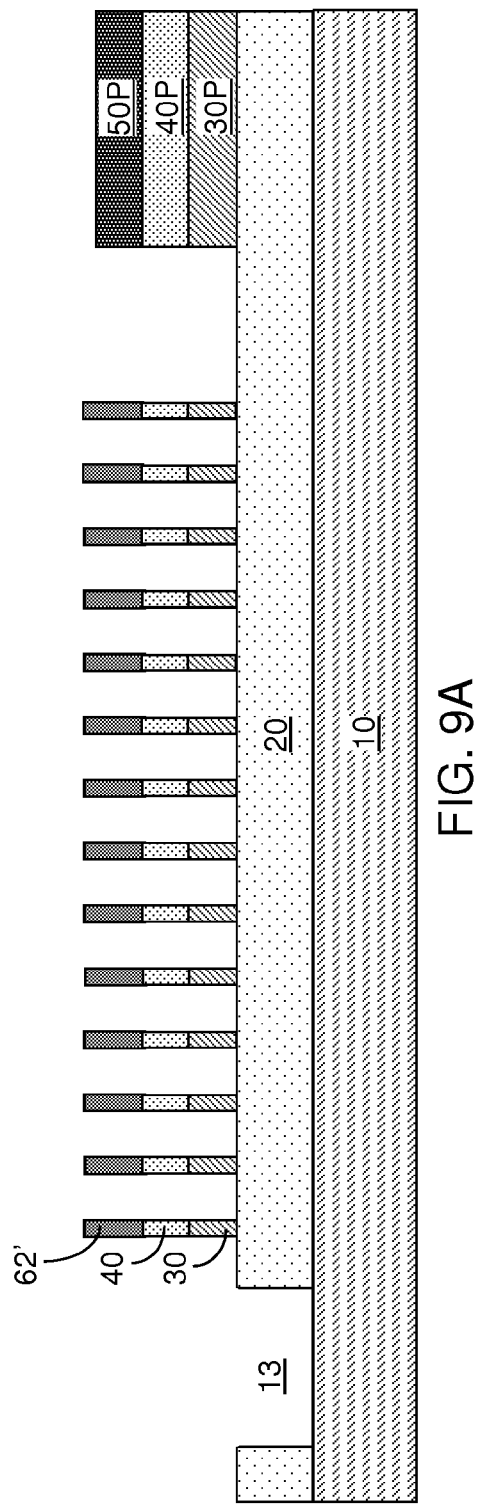
FIG. 9A is a vertical cross-sectional view of the exemplary semiconductor structure after formation of vertical stacks of a semiconductor fin, a dielectric fin, and a cap dielectric fin according to an embodiment of the present disclosure.
Figure 9B:
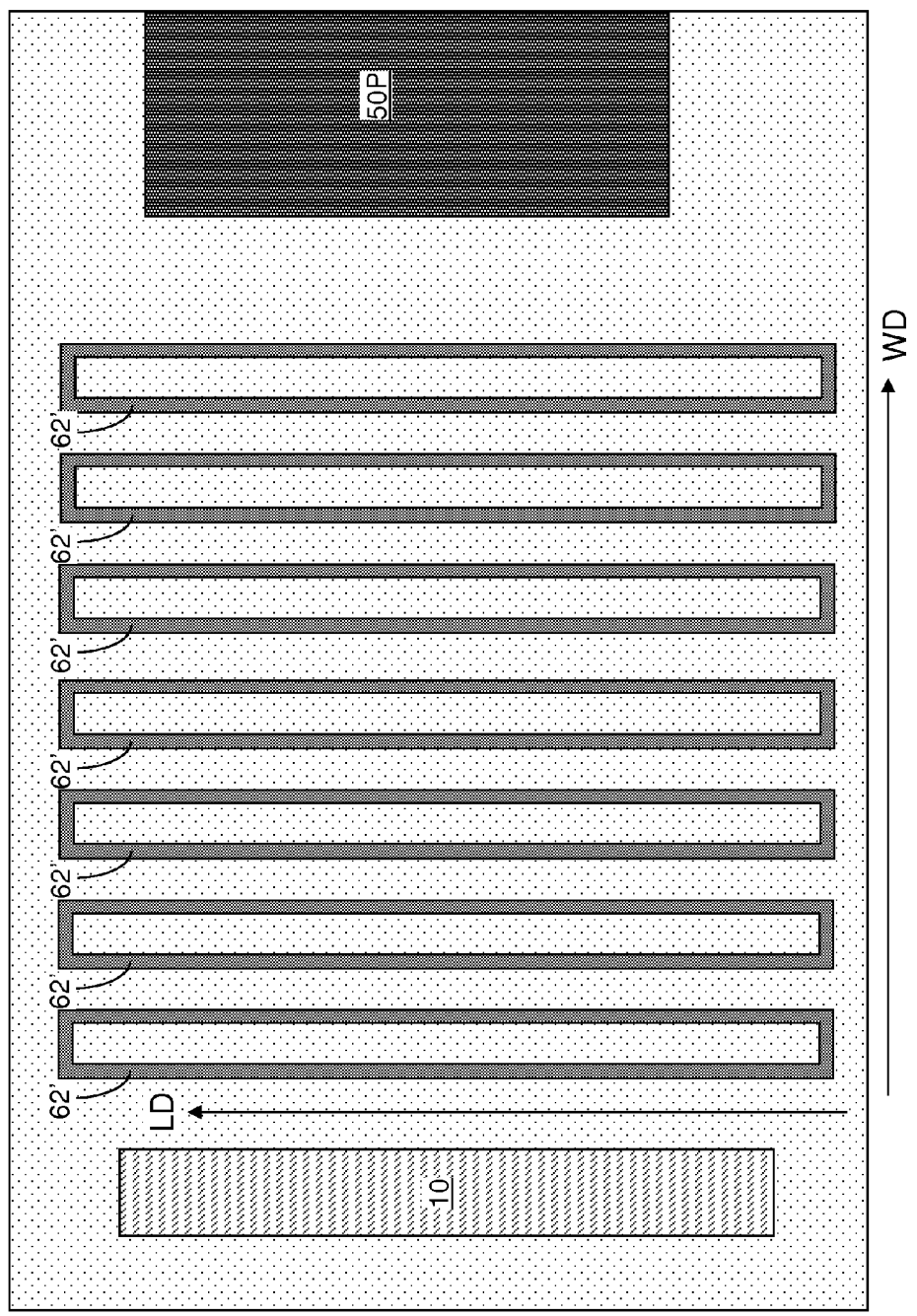
FIG. 9B is a top-down view of the exemplary structure of FIG. 9A.

Referring to FIGS. 9A and 9B, the pattern in the plurality of fin-defining dielectric spacers 62 is transferred through the stack of the first dielectric layer 40L and the top semiconductor layer 30L by an anisotropic etch that etches physically exposed portions of the first dielectric layer 40L and the top semiconductor layer 30L. The first dielectric layer 40L and the top semiconductor layer 30L are etched employing the plurality of fin-defining dielectric spacers 62 as an etch mask. The remaining portion of the first dielectric layer 40L underneath the upper dielectric pad portion 50P is herein referred to as a lower dielectric pad portion 40L. The remaining portion of the top semiconductor layer 30L underneath the upper dielectric pad portion 50P is herein referred to as a semiconductor portion 30P.

In another embodiment, the first dielectric layer 40L and top semiconductor layer 30L can be patterned into fin shapes using direct lithography. This is possible as long as the lithography technique to be used is able to achieve the desired fin pitch. Lithography techniques may include immersion 193 optical lithography with single or double exposures, EUV, or electron beam.

Vertical stacks, from bottom to top, of a semiconductor fin 30, a dielectric fin 40, and a cap dielectric fin 62' are formed on the top surface of the buried insulator layer 20. Each cap dielectric fin 62' is a remaining portion of a fin-defining dielectric spacer 62. Each dielectric fin 40 is a remaining portion of the first dielectric layer 40L. Each semiconductor fin 30 is a remaining portion of the top semiconductor layer 30L. In other words, patterned portions of the top semiconductor layer 30L constitute the plurality of semiconductor fins 30. Within each vertical stack (30, 40, 62'), the semiconductor fin 30, the dielectric fin 40, and the cap dielectric fin 62' have the same horizontal cross-sectional area, which is the same as the horizontal cross-sectional area of the fin-defining dielectric spacer 62 from which the cap dielectric fin 62' is derived. In one embodiment, the buried insulator layer 20 can be employed as an etch stop layer for the anisotropic etch that forms the vertical stacks. Each vertical stack (30, 40, 62') can extend over a greater lateral dimension along a lengthwise direction LD than along a widthwise direction WD.

In one embodiment, all of the fin-defining dielectric spacers 62 can be consumed during the anisotropic etch that transfers the pattern of the fin-defining dielectric spacers 62. In this case, the cap dielectric fins 62' are not present over each vertical stack of a semiconductor fin 30 and a dielectric fin 40.

Figure 10A:
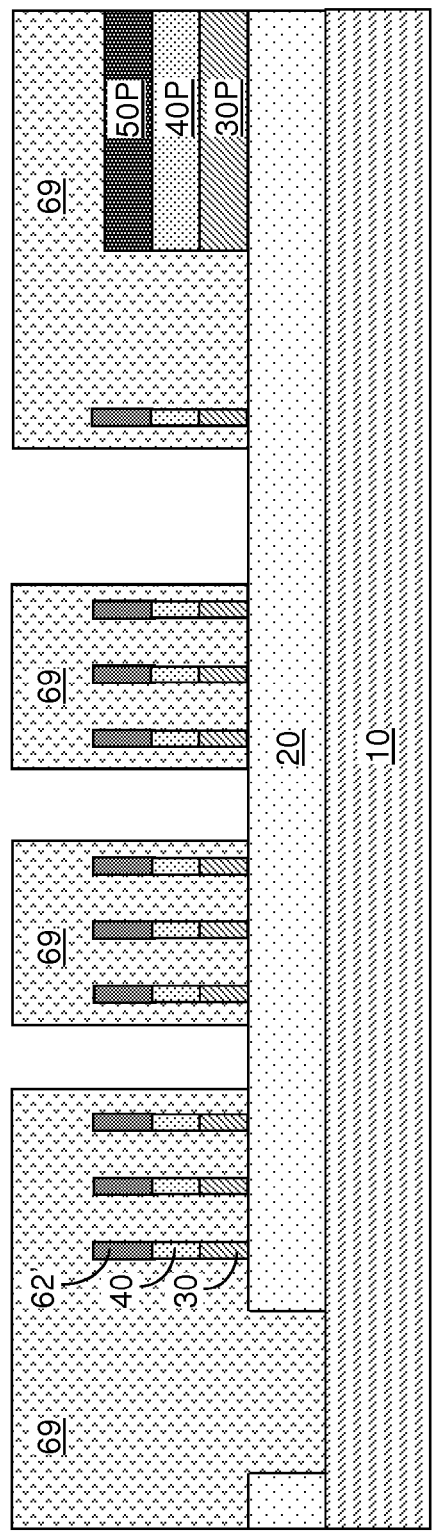
FIG. 10A is a vertical cross-sectional view of the exemplary semiconductor structure after removal of portions of the vertical stacks of a semiconductor fin, a dielectric fin, and a cap dielectric fin by masking with a lithographically patterned photoresist layer and an etch according to an embodiment of the present disclosure.
Figure 10B:
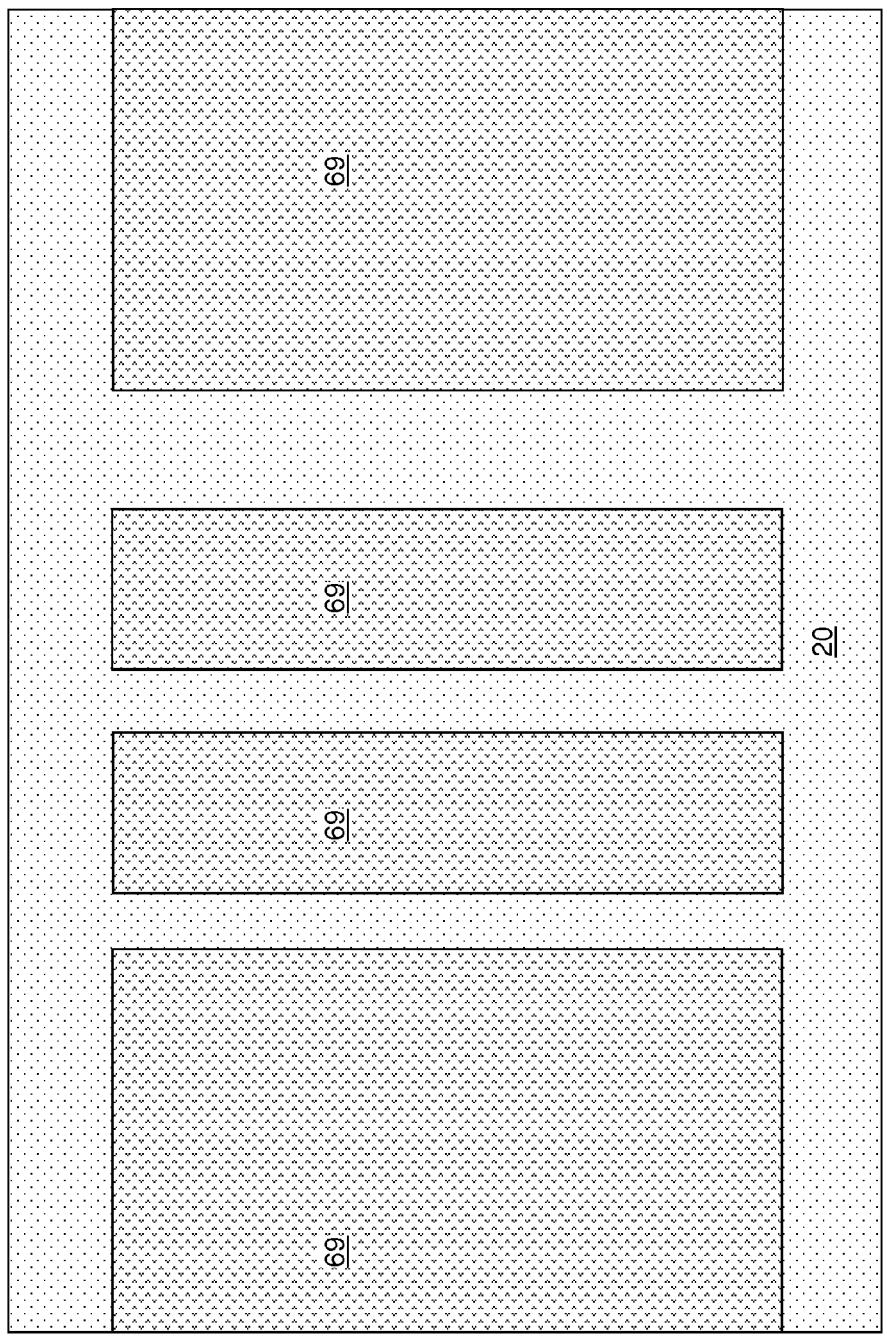
FIG. 10B is a top-down view of the exemplary structure of FIG. 10A.

Referring to FIGS. 10A and 10B, a photoresist layer 69 can be applied over the plurality of vertical stacks (30, 40, 62') and the dielectric pad portion 50P. The photoresist layer 69 is subsequently lithographically patterned to cover clusters of lengthwise portions of the vertical stacks (30, 40, 62') to be preserved to provide clusters remaining portions of the vertical stacks (30, 40, 62'), while physically exposing portions of the vertical stacks (30, 40, 62') to be removed. In one embodiment, each of the plurality of vertical stacks (30, 40, 62') can have a horizontal cross-sectional area of a rectangular ring that extends over a greater lateral dimension along a lengthwise direction than along a widthwise direction that is perpendicular to the lengthwise direction. In one embodiment, end portions of each vertical stack (30, 40, 62') located along the lengthwise direction can be physically exposed after patterning of the photoresist layer 69. The physically exposed end portions of each vertical stack (30, 40, 62') can be removed by an etch employing the photoresist layer 69 as an etch mask. The etch can be a wet etch or a dry etch. A vertical stack (30, 40, 62') having a horizontal cross-sectional area of a rectangular ring can be divided into two vertical stacks (30, 40, 62'), can be patterned into a single vertical stack (30, 40, 62'), or can be removed. After removal of the end portions of the vertical stacks (30, 40, 62') including the etched top semiconductor layer 30L (i.e., the semiconductor fins 30), the remaining portions of the etched top semiconductor layer 30L can include a plurality of semiconductor fins 30 that are parallel among one another.

Figure 11A:
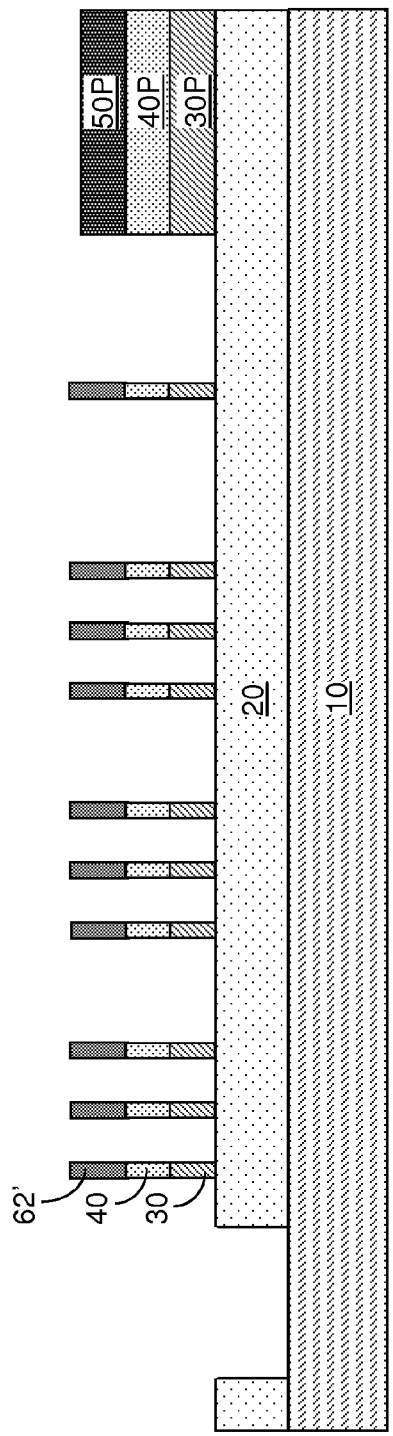
FIG. 11A is a vertical cross-sectional view of the exemplary semiconductor structure after removal of the lithographically patterned photoresist layer according to an embodiment of the present disclosure.
Figure 11B:
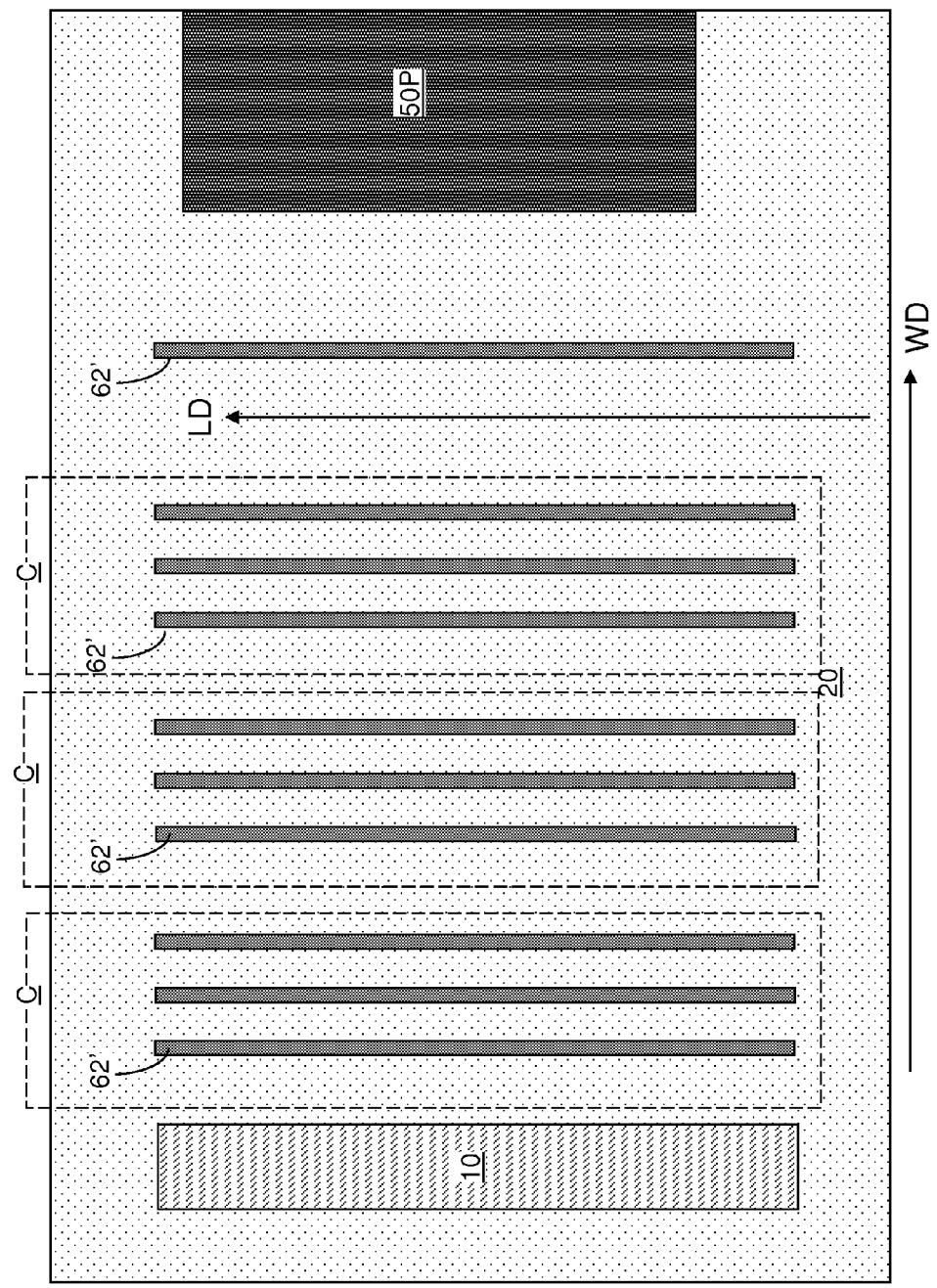
FIG. 11B is a top-down view of the exemplary structure of FIG. 11A.

Referring to FIGS. 11A and 11B, the photoresist layer 69 is subsequently removed, for example, by ashing. Each of the plurality of semiconductor fins 30 can extend over a greater horizontal distance along the lengthwise direction than along the widthwise direction. Each of the plurality of semiconductor fins 30 can have a rectangular cross-sectional shape. Each of the plurality of semiconductor fins 30 can be parallel to one another. Each of the plurality of parallel semiconductor fins 30 can have the same width along the widthwise direction WD.

A plurality of clusters C of vertical stacks (30, 40, 62') can be formed. Within each cluster C, the plurality of semiconductor fins 30 can be formed as a one-dimensional periodic array of semiconductor fins 30 having a pitch along the widthwise direction WD. The plurality of vertical stacks (30, 40, 62') extends over a greater horizontal distance along the lengthwise direction LD than along the widthwise direction WD. In one embodiment, each of the vertical stacks (30, 40, 62') can have a rectangular cross-sectional shape. Correspondingly, each of the plurality of semiconductor fins 30 can have the same rectangular cross-sectional shape.

In one embodiment, the fins may be patterned into clusters directly, i.e. instead of first forming fin shapes and then etching away some portions of the fin shapes originally formed, the desired final pattern of fin shapes could be formed directly. This is possible if a direct patterning technique is used, as described above.

For each semiconductor fin 30 in an isolated vertical stack (30, 40, 62') that does not belong to a cluster C and for each of the plurality of semiconductor fins 30 in a cluster C of vertical stacks (30, 40, 62'), the semiconductor fin 30 has a pair of parallel lengthwise vertical sidewalls that extend along the lengthwise direction LD. Within each cluster C of vertical stacks (30, 40, 62'), the plurality of semiconductor fins 30 are parallel among one another. In one embodiment, each of the plurality of semiconductor fins 30 can have the same width along the widthwise direction WD.

Each dielectric fin 40 is located on top of one a semiconductor fin 30. The horizontal cross-sectional shape of a dielectric fin 40 is the same as the horizontal cross-sectional shape of the underlying semiconductor fin 30.

For a pair of clusters C of vertical stacks (30, 40, 62'), the most proximate lateral distance between one cluster C of vertical stacks (30, 40, 62') and another cluster C of vertical stacks is greater than the spacing between a neighboring pair of vertical stacks (30, 40, 62') in any of the two clusters C of vertical stacks (30, 40, 62'). For a cluster C of vertical stacks (30, 40, 62') and an isolated vertical stack (30, 40, 62'), the most proximate lateral distance therebetween is greater than the spacing between a neighboring pair of vertical stacks (30, 40, 62') in the cluster C of vertical stacks (30, 40, 62').

Within each cluster C of vertical stacks (30, 40, 62'), a plurality of vertical stacks (30, 40, 62') can be arranged as a one-dimensional periodic array of semiconductor fins having a pitch along the widthwise direction WD. Correspondingly, within each cluster C of vertical stacks (30, 40, 62'), a plurality of semiconductor fins 30 can be arranged as a one-dimensional periodic array of semiconductor fins having a pitch along the widthwise direction WD.

Each of the semiconductor fins 30 in the exemplary structure of FIGS. 11A and 11B can extend over a greater horizontal distance along the same lengthwise direction LD than along the same widthwise direction WD.

In one embodiment, the most proximate lateral distance between one cluster C of vertical stacks (30, 40, 62') and another cluster C of vertical stacks can be an integer multiple of the pitch less the width of a semiconductor fin 30 along the widthwise direction WD. In one embodiment, the most proximate lateral distance between a cluster C of vertical stacks (30, 40, 62') and an isolated vertical stack (30, 40, 62') can be an integer multiple of the pitch less the width of a semiconductor fin 30 along the widthwise direction WD.

Figure 12:
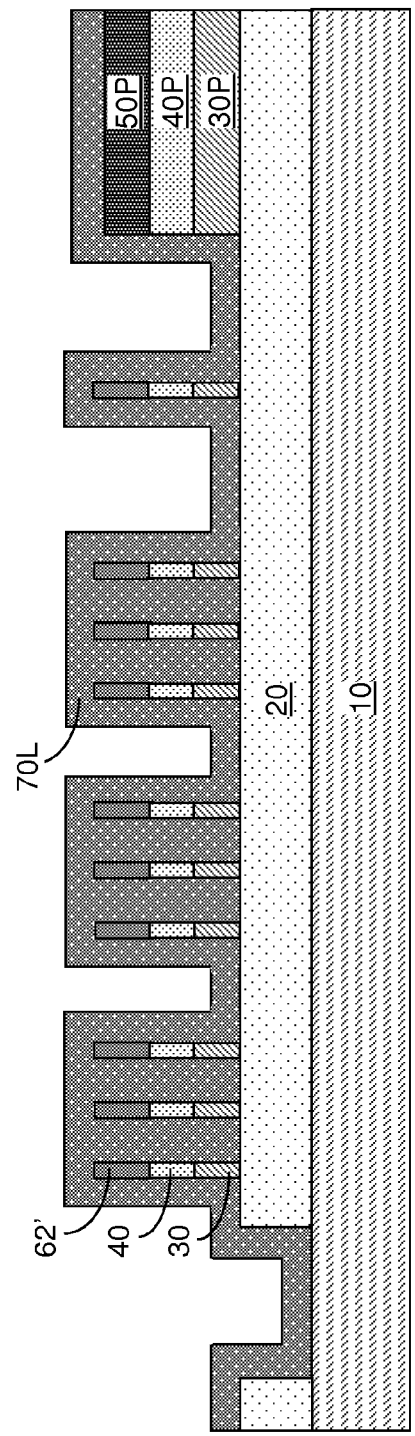
FIG. 12 is a vertical cross-sectional view of the exemplary semiconductor structure after formation of a template material layer according to an embodiment of the present disclosure.

Referring to FIG. 12, a template material layer 70L is deposited on the plurality of vertical stacks (30, 40, 62') and physically exposed surfaces the buried insulator layer 20, the semiconductor portion 30P, the lower dielectric pad portion 40P, and the upper dielectric pad portion 50P. The template material layer 70L is conformally deposited, i.e., with the same thickness throughout.

In one embodiment, the template material layer 70L can include a dielectric material, which is herein referred to as a first dielectric material. The first dielectric material can be different from the dielectric material of the buried insulator layer 20. The first dielectric material can be, for example, silicon nitride, porous or non-porous organosilicate glass (OSG), a dielectric metal oxide, amorphous carbon, diamond-like carbon, or an organic polymer. In one embodiment, the first dielectric material can be silicon nitride.

In another embodiment, the template material layer 70L can includes a semiconductor material having a different composition than the plurality of semiconductor fins 30. For example, the plurality of semiconductor fins 30 can include silicon, and the template material 70L can include germanium or a silicon-germanium alloy having an atomic concentration of germanium greater than 50%.

In yet another embodiment, the template material layer 70L can include a metallic material such as a metallic nitride. For example, the template material layer 70L can include tantalum nitride, titanium nitride, and/or tungsten nitride.

The thickness of the template material layer 70L is selected to be greater than one half of the maximum lateral spacing of a neighboring pair of vertical stacks (30, 40, 62') within each cluster C of a plurality of vertical stacks (30, 40, 62'). See FIG. 11B. If the plurality of vertical stacks (30, 40, 62') within a cluster C is a one-dimensional periodic array, the thickness of the template material layer 70L is selected to be greater than one half of the spacing between neighboring pairs of vertical stacks (30, 40, 62'). Thus, all gaps among the plurality of semiconductor fins 30 can be filled with the template material layer 70L.

Figure 13B:
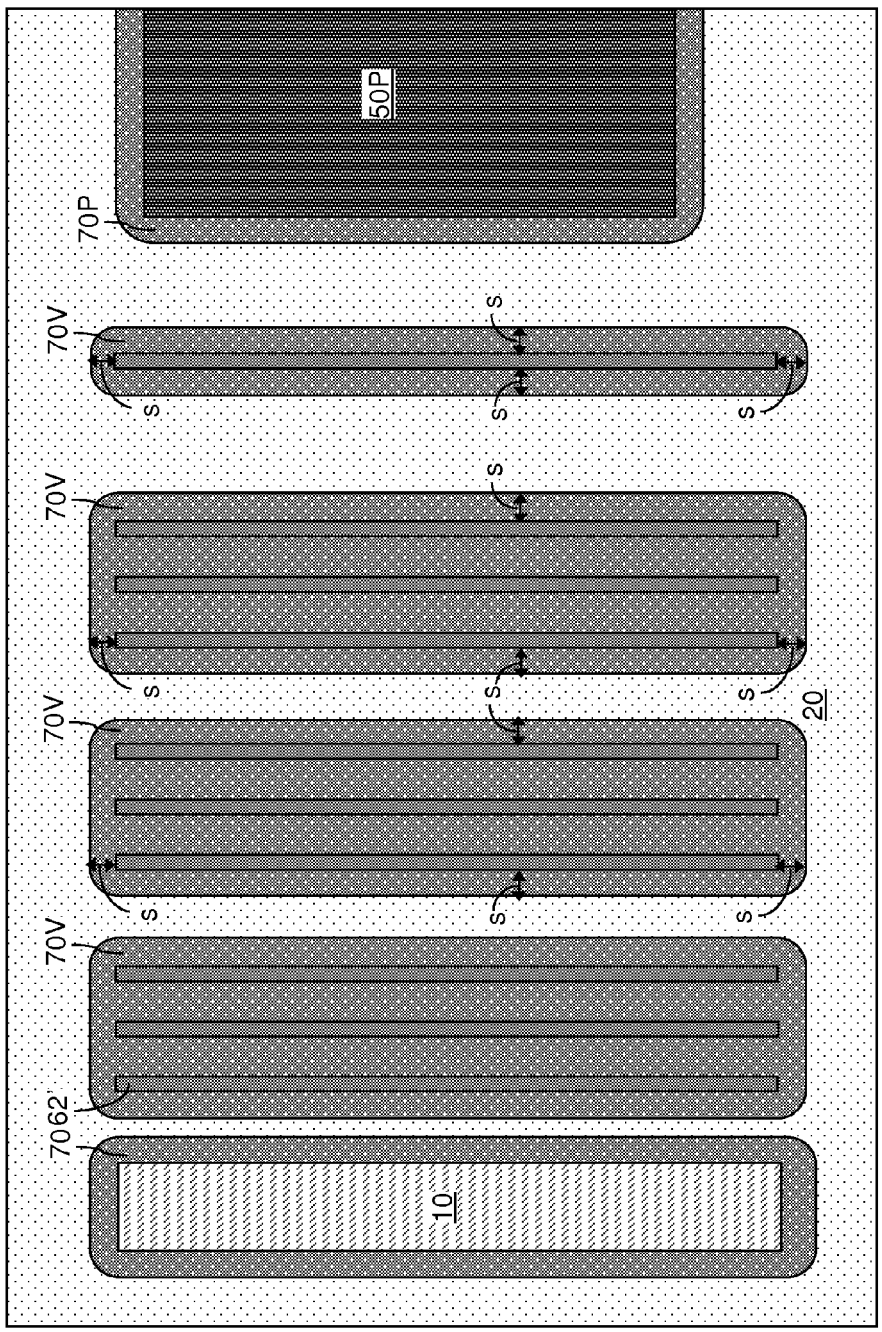
FIG. 13B is a top-down view of the exemplary structure of FIG. 13A.

Referring to FIGS. 13A and 13B, the template material layer 70L is anisotropically etched to remove horizontal portions thereof. The remaining vertical portions of the template material layer 70L include template material portions 70V that are in contact with the vertical stacks (30, 40, 62'), a lower template material spacer 70 in contact with sidewalls of the buried insulator layer 20, and an upper template material spacer 70P in contact with sidewalls of the stack of the semiconductor portion 30P, the lower dielectric pad portion 40P, and the upper dielectric pad portion 50P. The template material portions 70V, the lower template material spacer 70, and the upper template material spacer 70P have the same width, which is herein referred to as a lateral spacing s. In one embodiment, the top surface of each cap dielectric fin 62' can be physically exposed after removal of the horizontal portions of the template material layer 70L.

Each template material portion 70V is in contact with sidewalls of at least one vertical stack (30, 40, 62') of a semiconductor fin 30, a dielectric fin 40, and a cap dielectric fin 62'. For each template material portion 70V, a contiguous outer vertical surface of the template material portion 70V laterally surrounds at least one vertical stack (30, 40, 62') of a semiconductor fin 30, a dielectric fin 40, and a cap dielectric fin 62'. The outer vertical surface of each template material portion 70V is laterally spaced from outermost sidewalls of the at least one semiconductor fin 30 therein by a same distance, i.e., by the lateral spacing s, throughout the entirety of the outer vertical surface upon formation of the template material portion 70V.

Each template material portion 70V is topologically homeomorphic to a torus having at least one hole therein, i.e., can be continuously deformed to a torus without forming a new hole or destroying an existing hole. As used herein, being "topologically homeomorphic" refers to meeting the definition of topological homeomorphism as known in the field of mathematics. The total number of at least one hole within the torus is the same as the total number of the at least one semiconductor fin 30 laterally surrounded by the template material portion 70V.

In one embodiment, a horizontal cross-sectional shape of a contiguous outer surface of a template material portion 70V can be a rounded rectangle in which the curvature of radius of four rounded corners is the same as the lateral spacing s, which is the same for all of the template material portions 70V. A gap is present between each pair of template material portions 70V above the top surface of the buried insulator layer 20.

Referring to FIG. 14, a dielectric material is deposited in the gaps among the template material portions 70V, a recessed portion of the buried insulator layer 20 laterally surrounded by the lower template material spacer 70, and the space around the upper template material spacer 70P to form a raised dielectric layer 80. The raised dielectric layer 80 includes a material different from the material of the template material portions 70V. The raised dielectric layer 80 is "raised" above, i.e., located above, the top surfaces of the plurality of semiconductor fins 30.

In one embodiment, the template material portions 70V can include a first dielectric material, and the raised dielectric layer 80 can include a second dielectric material different from the first dielectric material. In one embodiment, the first dielectric material can be selected from silicon nitride, porous or non-porous organosilicate glass (OSG), a dielectric metal oxide, amorphous carbon, diamond-like carbon, or an organic polymer, and the second dielectric material can be selected from silicon oxide, porous or non-porous organosilicate glass (OSG), a dielectric metal oxide, amorphous carbon, diamond-like carbon, or an organic polymer, provided that the second dielectric material is different from the first dielectric material. In one embodiment, the first dielectric material can be silicon nitride and the second dielectric material can be silicon oxide.

In another embodiment, the template material portion 70V can include a material that is not a dielectric material, and the raised dielectric layer 80 can include a dielectric material.

The raised dielectric layer 80 can be deposited, for example, by conformal chemical vapor deposition (CVD) or by spin-coating.

Figure 15:
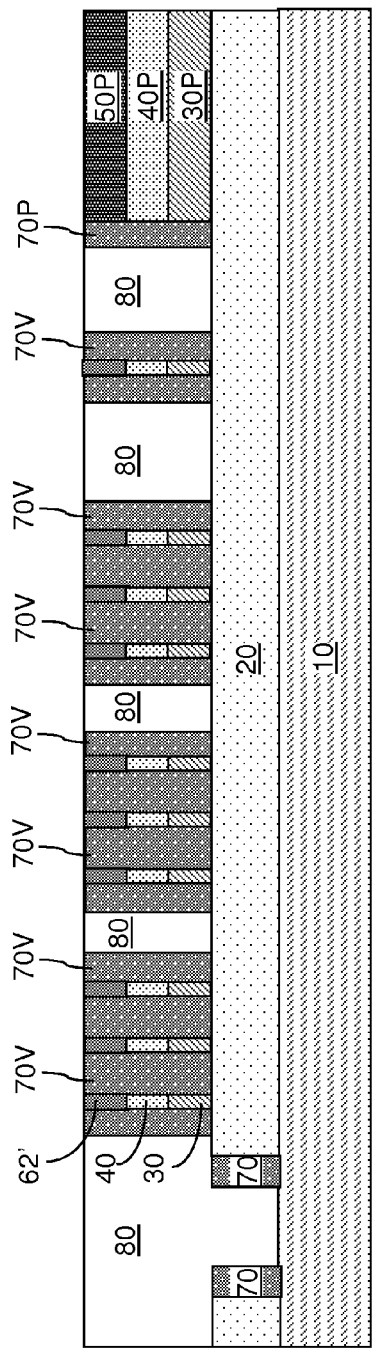
FIG. 15 is a vertical cross-sectional view of the exemplary structure after planarization of the raised dielectric layer according to an embodiment of the present disclosure.

Referring to FIG. 15, the raised dielectric layer 80 is planarized, for example, by a recess etch and/or chemical mechanical planarization. In one embodiment, the template material portions 70V can be employed as a stopping layer for the planarization process.

Figure 16A:
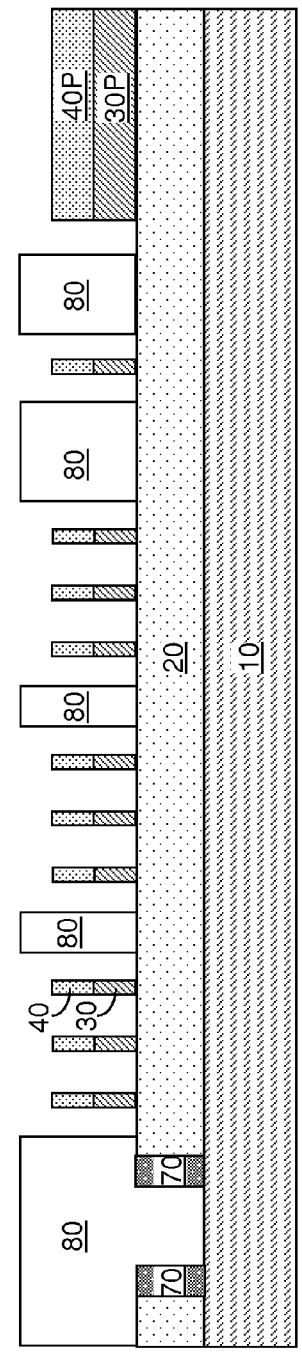
FIG. 16A is a vertical cross-sectional view of the exemplary structure after removal of the template material portions selective to the raised dielectric layer according to an embodiment of the present disclosure.
Figure 16B:
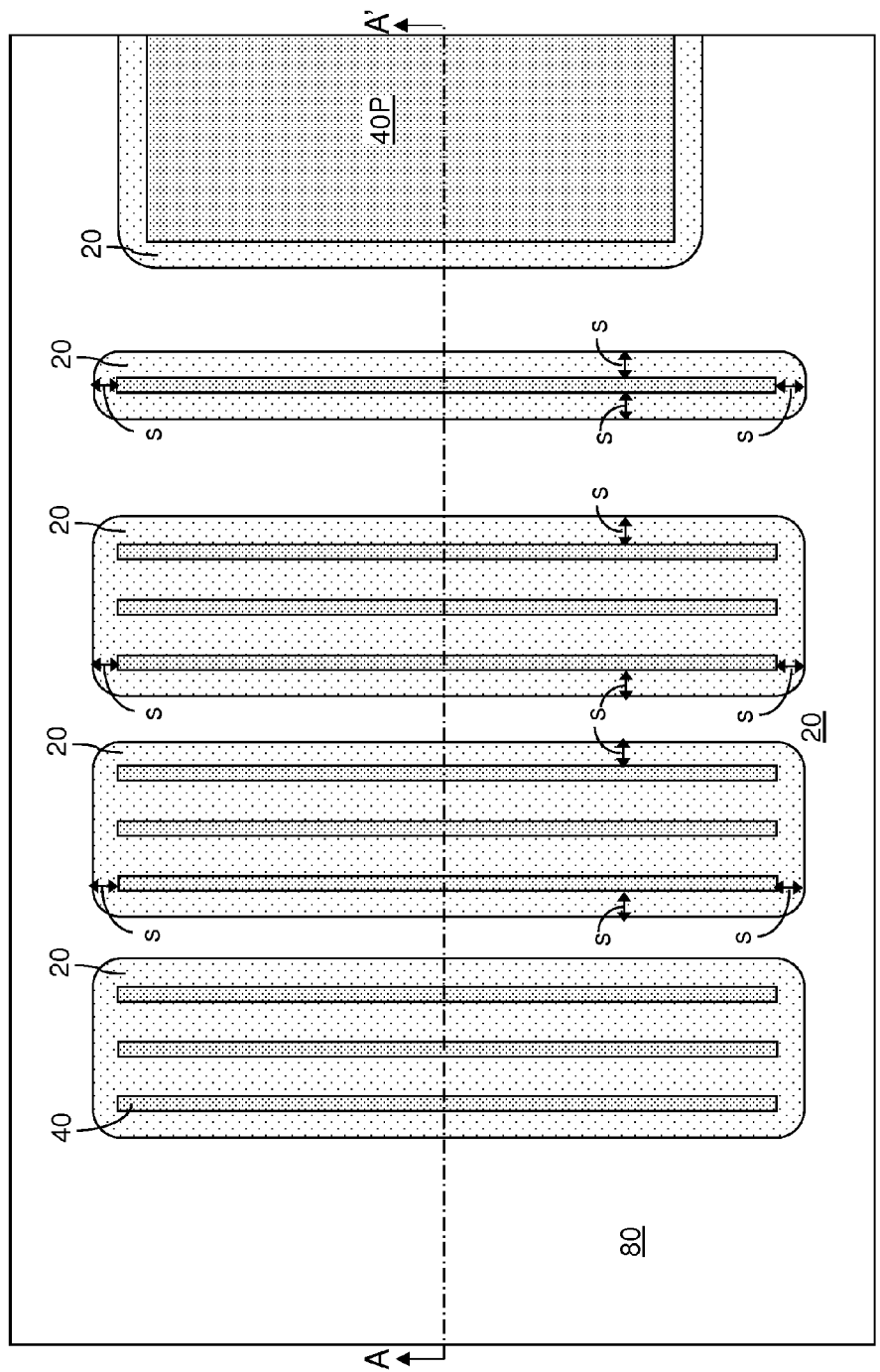
FIG. 16B is a top-down view of the exemplary structure of FIG. 16B.

FIGS. 16A and 16B, the template material portions 70V and the upper template material spacer 70P are removed selective to the raised dielectric layer 80. Further, the cap dielectric fins 62' can be removed from above the dielectric fins 40 concurrently with, or after, removal of the template material portions 70V. The upper dielectric pad portion 50P can be removed during removal of the template material portions 70V and/or during removal of the cap dielectric fins 62'.

Each trench includes at least one vertical stack of a semiconductor fin 30 and a dielectric fin 40. For each trench, all vertical sidewalls of each trench are laterally spaced from outermost sidewalls of the at least one semiconductor fin 30 by the lateral spacing s, which is the same irrespective of location of measurement within the trench.

The lateral spacing s is the same as the thickness of the template material layer 70L as deposited at the processing step of FIG. 12. Because the thickness of the template material layer 70L is selected to prevent filling of a gap between different clusters of vertical stacks (30, 40, 62') or between an isolated vertical stack (30, 40, 62') and any other vertical stack (30, 40, 62'), the most proximate lateral distance between at least one semiconductor fin 30 located within a trench and at least another semiconductor fin 30 located within another trench is greater than twice the lateral spacing s.

The height of the top surface of the raised isolation dielectric layer 80 relative to the top surfaces of the semiconductor fins 30 is an important process parameter and can be controlled to be equivalent, higher, or lower by tuning the dielectric fin thickness, the process used to planarize the raised dielectric layer and expose the template material, and with cleans or etches which may be interspersed throughout the process, as well known to those in the art. In one embodiment, a horizontal cross-sectional shape of a trench can be a rounded rectangle in which a curvature of radius of four rounded corners is the lateral spacing s.

Figure 17C:
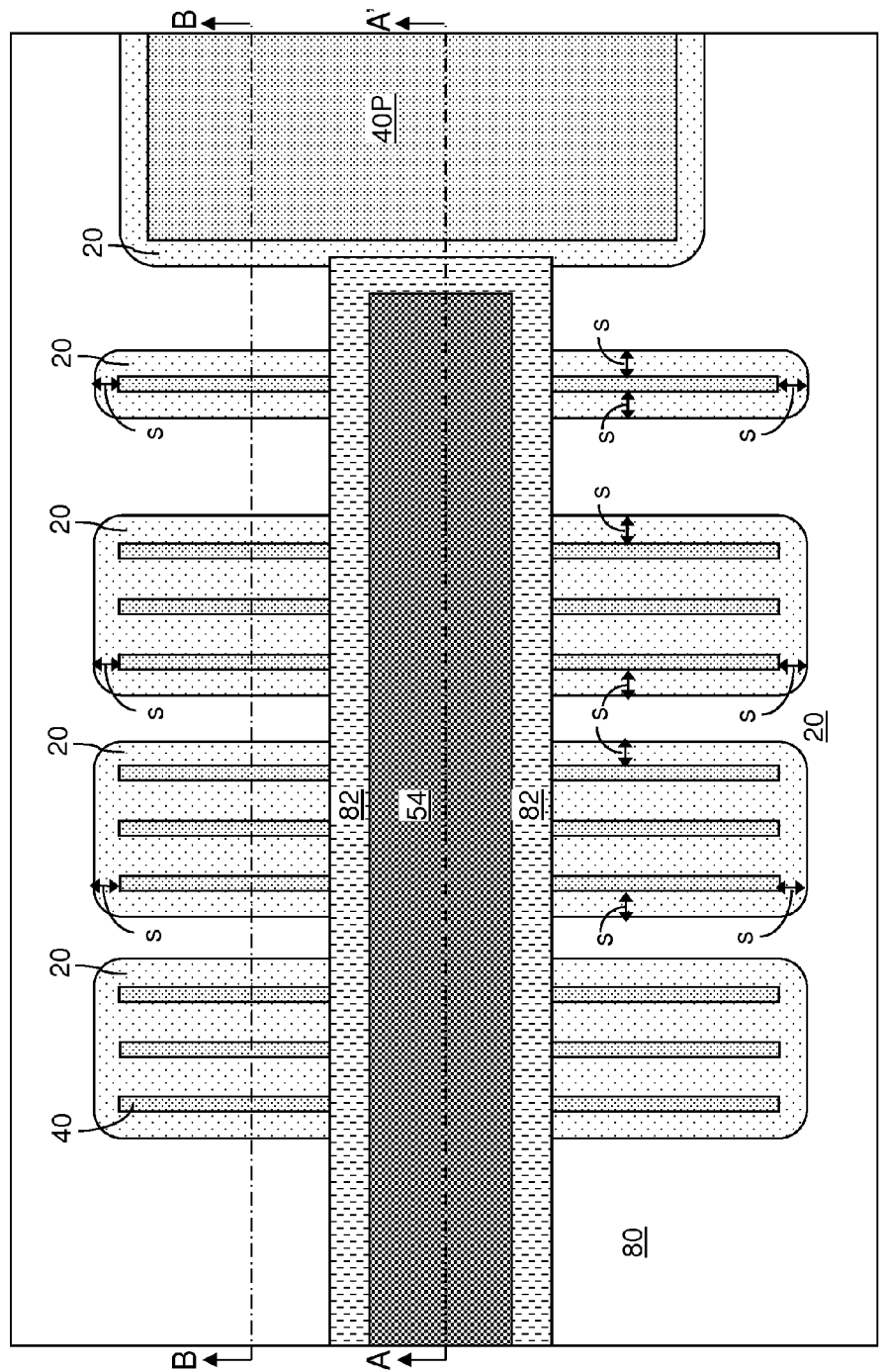
FIG. 17C is a top-down view of the exemplary structure at the processing steps of FIGS. 17A and 17B according to an embodiment of the present disclosure.

Referring to FIGS. 17A, 17B, and 17C, a gate dielectric 52, a gate electrode 54, and a gate spacer 82 can be formed. For example, the gate dielectric 52 and the gate electrode 54 can be formed by forming and patterning a stack of a gate dielectric layer and a gate electrode layer. Source extension regions (not shown) and drain extension regions (not shown) can be optionally formed by ion implantation after formation of the gate dielectric 52 and the gate electrode 54. The gate spacer 82 can be formed, for example, by depositing a conformal dielectric layer, and anisotropically etching the conformal dielectric layer.

Referring to FIGS. 18A, 18B, and 18C, source/drain regions 30SD are formed within portions of the semiconductor fins 30 that are not covered by the gate electrode 54 or the gate spacer 82, for example, by ion implantation. As used herein, a "source/drain region" can be a source region or a drain region. A portion of each semiconductor fin 30 that is not implanted during formation of the source extension regions, drain extension regions, and source/drain regions 30SD is herein referred to as a body region 30B, which includes a channel of a field effect transistor.

Optionally, selective epitaxy can be performed to form raised source/drain regions 30R. Each raised source/drain region 30R can fill a portion of a trench. The lateral extent of each raised source/drain region 30R is limited by the lateral extent of the trench in which the raised source/drain region 30R is located. Thus, the lateral width of outer portions of each raised source/drain region 30R is the same as the lateral spacing s. See FIG. 16B. The top surfaces of the raised source/drain regions 30R are raised above the top surfaces of the dielectric fins 40.

The raised dielectric layer 80 of the present disclosure provides a more planar topography of top surfaces of the exemplary structure after formation of the raised source/drain regions 30R compared with prior art structures that do not include any raised dielectric layer. Further, the raised dielectric layer 80 limits the lateral extent of the raised source/drain regions 30R, thereby preventing electrical shorts between adjacent raised source/drain regions 30R due to deposition of an excessive semiconductor material during the selective epitaxy. Yet further, lithographic patterning of upper level structures to be subsequently formed above the exemplary structure of FIGS. 18A, 18B, and 18C becomes easier compared to prior art because of the improved planarity, i.e., reduced topography of the top surfaces, in the exemplary structure of the present disclosure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure, said method comprising:
   forming at least one semiconductor fin on an insulator layer;
   forming a template material portion directly on said at least one semiconductor fin, wherein said at least one semiconductor fin is a plurality of semiconductor fins, and gaps among said plurality of semiconductor fins are filled with said template material portion;
   forming a raised dielectric layer on said insulator layer by depositing a dielectric material on said insulator layer and said template material portion and planarizing said dielectric material; and
   forming a trench by removing said template material portion selective to said raised dielectric layer, wherein vertical sidewalls of said trench are laterally spaced from outermost sidewalls of said at least one semiconductor fin by a same lateral spacing.

2. The method of claim 1, wherein outer vertical surface of said template material portion is laterally spaced from outermost sidewalls of said at least one semiconductor fin by said same lateral spacing upon formation.

3. The method of claim 1, wherein said template material portion is formed by:
   conformally depositing a template material layer over said at least one semiconductor fin and said insulator layer; and
   removing horizontal portions of said template material layer by an anisotropic etch, wherein a remaining portion of said template material layer is said template material portion.

4. The method of claim 1, wherein said planarizing of said dielectric material comprises removing said dielectric material employing portions of said template material layer as a stopping layer.

5. The method of claim 1, wherein said at least one semiconductor fin is a plurality of semiconductor fins, and for each pair of neighboring parallel sidewalls of said plurality of semiconductor fins that are oriented along a lengthwise direction, a spacing between said pair does not exceed twice said same lateral spacing.

6. The method of claim 1, wherein said template material portion comprises a first dielectric material, and said raised dielectric layer comprises a second dielectric material different from said first dielectric material.

7. The method of claim 1, wherein said template material portion comprises a material selected from a semiconductor material having a different composition than said at least one semiconductor fin, amorphous carbon, diamond-like carbon, an organic polymer, and a metallic nitride.

8. The method of claim 1, further comprising:
   forming at least another semiconductor fin on said insulator layer;
   forming another template material portion directly on said at least another semiconductor fin concurrently with formation of said template material portion; and
   forming another trench by removing said another template material portion selective to said raised dielectric layer, wherein vertical sidewalls of said another trench are laterally spaced from outermost sidewalls of said at least another semiconductor fin by said same lateral spacing.

9. The method of claim 8, wherein each of said at least one semiconductor fin and said at least another semiconductor fin extends over a greater horizontal distance along a same lengthwise direction than along a same widthwise direction, and each of said at least one semiconductor fin has a rectangular cross-sectional shape.

10. The method of claim 9, wherein a horizontal cross-sectional shape of said trench is a rounded rectangle in which a curvature of radius of four rounded corners is said same lateral spacing.

11. A method of forming a semiconductor structure, said method comprising:
   forming at least one semiconductor fin on an insulator layer;
   forming at least one vertical stack on said insulator layer, wherein each of said at least one vertical stack comprises, from bottom to top, one of said at least one semiconductor fin, a dielectric fin, and a cap dielectric fin;
   forming a template material portion directly on said at least one semiconductor fin
      by conformally depositing a template material layer over said at least one semiconductor fin and said insulator layer, and
      by removing horizontal portions of said template material layer by an anisotropic etch, wherein a remaining portion of said template material layer is said template material portion;
   forming a raised dielectric layer on said insulator layer by depositing a dielectric material on said insulator layer and said template material portion and planarizing said dielectric material; and
   forming a trench by removing said template material portion selective to said raised dielectric layer, wherein vertical sidewalls of said trench are laterally spaced from outermost sidewalls of said at least one semiconductor fin by a same lateral spacing.

12. The method of claim 11, wherein said template material layer is formed on sidewalls of said at least one vertical stack.

13. The method of claim 11, wherein a top surface of each cap dielectric fin is physically exposed after said removing of said horizontal portions of said template material layer.

14. The method of claim 11, further comprising removing said cap dielectric fin from above said dielectric fin concurrently with, or after, removal of said template material portion.

15. A method of forming a semiconductor structure, said method comprising:
   forming at least one semiconductor fin on an insulator layer;
   forming a template material portion directly on said at least one semiconductor fin wherein said template material portion is topologically homeomorphic to a torus having at least one hole therein, wherein a total number of said at least one hole is the same as a total number of said at least one semiconductor fin;
   forming a raised dielectric layer on said insulator layer by depositing a dielectric material on said insulator layer and said template material portion and planarizing said dielectric material; and
   forming a trench by removing said template material portion selective to said raised dielectric layer, wherein vertical sidewalls of said trench are laterally spaced from outermost sidewalls of said at least one semiconductor fin by a same lateral spacing.

16. A method of forming a semiconductor structure, said method comprising:
   forming at least one semiconductor fin on an insulator layer;
   forming a template material portion directly on said at least one semiconductor fin;
   forming a raised dielectric layer on said insulator layer by depositing a dielectric material on said insulator layer and said template material portion and planarizing said dielectric material; and
   forming a trench by removing said template material portion selective to said raised dielectric layer, wherein vertical sidewalls of said trench are laterally spaced from outermost sidewalls of said at least one semiconductor fin by a same lateral spacing, wherein a horizontal cross-sectional shape of a contiguous outer surface of said template material portion is a rounded rectangle in which a curvature of radius of four rounded corners is the same as said same lateral spacing.

17. A method of forming a semiconductor structure, said method comprising:
   forming at least one semiconductor fin on an insulator layer by providing a semiconductor-on-insulator layer comprising a top semiconductor layer and said insulator layer, and by patterning said top semiconductor layer, wherein a subset of patterned portions of said top semiconductor layer comprise said at least one semiconductor fin;
   forming a template material portion directly on said at least one semiconductor fin;
   forming a raised dielectric layer on said insulator layer by depositing a dielectric material on said insulator layer and said template material portion and planarizing said dielectric material; and
   forming a trench by removing said template material portion selective to said raised dielectric layer, wherein vertical sidewalls of said trench are laterally spaced from outermost sidewalls of said at least one semiconductor fin by a same lateral spacing.

18. The method of claim 17, wherein said patterning of said top semiconductor layer comprises:
   forming at least one mandrel structure over said top semiconductor layer;
   forming a fin-defining dielectric spacer on each of said at least one mandrel structure;
   removing said at least one mandrel structure; and
   etching said top semiconductor layer employing said at least one fin-defining dielectric spacer as an etch mask.

19. The method of claim 18, further comprising removing end portions of said etched top semiconductor layer, wherein remaining portions of said etched top semiconductor layer comprise a plurality of semiconductor fins including said at least one semiconductor fin.

20. A method of forming a semiconductor structure, said method comprising:
   forming at least one semiconductor fin on an insulator layer, wherein said at least one semiconductor fin is formed as a plurality of parallel semiconductor fins extending over a greater horizontal distance along a lengthwise direction than along a widthwise direction, and each of said plurality of parallel semiconductor fins has a same width along said widthwise direction;
   forming a template material portion directly on said at least one semiconductor fin;
   forming a raised dielectric layer on said insulator layer by depositing a dielectric material on said insulator layer and said template material portion and planarizing said dielectric material; and forming a trench by removing said template material portion selective to said raised dielectric layer, wherein vertical sidewalls of said trench are laterally spaced from outermost sidewalls of said at least one semiconductor fin by a same lateral spacing.

21. The method of claim 20, wherein said plurality of semiconductor fins is formed as a one-dimensional periodic array of semiconductor fins having a pitch along said widthwise direction.

22. The method of claim 21, wherein for each pair of neighboring parallel sidewalls of said plurality of semiconductor fins that are oriented along a lengthwise direction, a spacing between said pair does not exceed twice said same lateral spacing.

* * * * *